United States Patent
Ang et al.

(10) Patent No.: US 6,743,291 B2
(45) Date of Patent: Jun. 1, 2004

(54) METHOD OF FABRICATING A CMOS DEVICE WITH INTEGRATED SUPER-STEEP RETROGRADE TWIN WELLS USING DOUBLE SELECTIVE EPITAXIAL GROWTH

(75) Inventors: Chew Hoe Ang, Singapore (SG); Wenhe Lin, Singapore (SG); Jia Zhen Zheng, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 177 days.

(21) Appl. No.: 10/191,850

(22) Filed: Jul. 9, 2002

(65) Prior Publication Data

US 2004/0007170 A1 Jan. 15, 2004

(51) Int. Cl.$^7$ ............................................. C30B 25/22
(52) U.S. Cl. ........................ 117/90; 117/93; 117/94; 117/95; 117/101; 117/165; 117/935; 438/480; 438/481; 438/514
(58) Field of Search ....................... 117/90, 93, 94, 117/95, 101, 105, 935; 438/480, 481, 514

(56) References Cited

U.S. PATENT DOCUMENTS

| 6,137,141 | A | 10/2000 | Son et al. | 257/345 |
|---|---|---|---|---|
| 6,143,593 | A | 11/2000 | Augusto | 438/199 |
| 6,187,643 | B1 | 2/2001 | Borland | 438/302 |
| 6,228,725 | B1 | 5/2001 | Nandakumar et al. | 438/289 |
| 6,323,073 | B1 * | 11/2001 | Yeh et al. | 438/181 |
| 6,444,550 | B1 * | 9/2002 | Hao et al. | 438/530 |
| 6,580,137 | B2 * | 6/2003 | Parke | 257/401 |
| 2002/0001890 | A1 * | 1/2002 | Lee | 438/184 |
| 2002/0001930 | A1 * | 1/2002 | Lee | 438/585 |
| 2002/0033511 | A1 * | 3/2002 | Babcock et al. | 257/408 |

\* cited by examiner

*Primary Examiner*—Robert Kunemund
(74) *Attorney, Agent, or Firm*—George O. Saile; Rosemary L.S. Pike (57) ABSTRACT

A process of fabricating a CMOS device comprised with super-steep retrograde (SSR), twin well regions, has been developed. The process features the use of two, selective epitaxial growth (SEG), procedures, with the first SEG procedure resulting in the growth of bottom silicon shapes in the PMOS, as well as in the NMOS region of the CMOS device. After implantation of the ions needed for the twin well regions, into the bottom silicon shapes, a second SEG procedure is employed resulting in growth of top silicon shapes on the underlying, implanted bottom silicon shapes. An anneal procedure then distributes the implanted ions resulting in an SSR N well region in the composite silicon shape located in the PMOS region, and resulting in an SSR P well region in the composite silicon shape located in the NMOS region of the CMOS device.

28 Claims, 5 Drawing Sheets

METHOD OF FABRICATING A CMOS DEVICE WITH INTEGRATED SUPER-STEEP RETROGRADE TWIN WELLS USING DOUBLE SELECTIVE EPITAXIAL GROWTH

BACKGROUND OF THE INVENTION (1) Field of the Invention

The present invention relates to methods used to fabricate semiconductor devices, and more specifically to a method used to fabricate a complimentary metal oxide semiconductor (CMOS), device, using a process featuring super-steep retrograde (SSR), twin wells, and double selective epitaxial growth.

(2) Description of Prior Art

Micro-miniaturization, or the ability to fabricate semiconductor devices with sub-micron features have allowed device performance to be increased, while the processing cost for a specific semiconductor chip comprised with devices formed with sub-micron features has been reduced. The reduced dimensions have resulted in decreases in performance degrading parasitic capacitances, while smaller semiconductor chips, still providing device densities equal to, or greater than counterpart larger chips, allow a greater number of semiconductor chips to be obtained from a specific size semiconductor wafer thus reducing the processing cost for a specific semiconductor chip. However performance increases experienced with devices formed with sub-micron features, can present reliability as well as yield concerns not present for devices formed using larger features. Channel lengths, the region under the gate structure located between source/drain regions, have now been reduced to levels less than 0.15 um. These sub-micron channel lengths although providing performance enhancements, can also result in unwanted short channel effects as well as reduced carrier mobility. Formation of well regions, offering increased doping at the top portion of the channel region can reduce short channel effects as well as increasing carrier mobility, however at the expense of increasing the threshold voltage of the device. Since power consumption is an important characteristic parameter for devices used for cellular telephones and notebook computers, the higher threshold voltage resulting from the use of conventional well regions, is not an acceptable solution.

The use of super-steep retrograde (SSR), well regions, featuring a peak dopant concentration needed to reduce short channel effects, located in the center of the SSR well region, and a lower dopant concentration located at the top surface of the SSR well region, needed to allow the use of a lower threshold voltage, can be used to optimize these device characteristics. The present invention will provide a method of fabricating a CMOS device featuring integration of an SSR twin-well region with an isolation structure, using two selective epitaxial growth (SEG) procedures. The simplified process of integrating SSR twin-well regions and isolation structures, described in this present invention, will feature reduced implantation energies for formation of the well regions, however still providing the needed dopant concentrations for minimizing short channel effects. Prior art such as: Augusto, in U.S. Pat. No. 6,143,593; Nandakumar et al, in U.S. Pat. No. 6,228,725 B1; Borland, in U.S. Pat. No. 6,187,643 B1; and Son et al, in U.S. Pat. No. 6,137,141, have described processes for forming semiconductor devices, some comprised with SSR wells, and some formed using selective epitaxial growth procedures. These prior arts however do not describe the novel procedure now described in the present invention in which a combination of process steps, such as double SEG, as well as integration of SSR well regions and isolation structures, are used to fabricate a CMOS device with reduced risk of short channel effects, while still providing a channel region which allows a low threshold voltage to be realized.

SUMMARY OF THE INVENTION

It is an object of this invention to fabricate a CMOS device featuring the integration of SSR twin-well regions and isolation structures.

It is another object of this invention to use two selective epitaxial growth procedures to provide the silicon shapes for the twin well regions.

It is still another object of this invention to provide an initial silicon shape, formed via a first SEG procedure, to accept the implanted ions for the SSR twin well regions, followed by a second SEG and anneal procedure, allowing the final profile for the SSR twin well regions, to be defined in a final, or in a composite silicon shape.

In accordance with the present invention a process for fabricating a CMOS device, featuring the integration of SSR twin well regions and isolation features, achieved via implementation of two SEG procedures, is described. After formation of insulator shapes on a semiconductor substrate, a first selective epitaxial growth (SEG), procedure is used to place bottom silicon shapes on portions of the semiconductor substrate not occupied by the insulator shapes. A first bottom silicon shape, located in a region of the semiconductor substrate to be used for a P channel metal oxide semiconductor (PMOS) device, is subjected to an N type ion implantation procedure placing N type ions in a specific portion of the first bottom silicon shape needed for an SSR N well region, while a second bottom silicon shape, located in a region of the semiconductor substrate to be used for an N channel metal oxide semiconductor (NMOS), device, is subjected to a P type ion implantation procedure placing P type ions in a specific portion of the second bottom silicon shape, needed for an SSR P well region. A second SEG procedure is next employed resulting in final silicon shapes, each comprised of an overlying top silicon shape and underlying bottom silicon shape. An anneal procedure is next performed resulting in the formation of a SSR N well region in the final, or composite silicon shape of the PMOS region, and resulting in the formation of a SSR P well region in the final silicon shape located in the NMOS region, with the highest concentration of dopants located in the underlying bottom silicon shapes, while a lower dopant region is located in the top portion of the overlying, top silicon shapes. After growth of a gate insulator layer, and definition of gate structures, implanted pocket or halo regions and lightly doped source/drain regions are formed in the final silicon shapes of both PMOS and NMOS regions, not covered by gate structures. After formation of insulator spacers on the sides of the gate structures, heavily doped source/drain regions are formed in portions of the final silicon shapes not covered by gate structures or by insulator spacers.

BRIEF DESCRIPTION OF THE DRAWINGS

The object and other advantages of this invention are best described in the preferred embodiments with reference to the attached drawings that include.

DESCRIPTION OF THE PREFERRED EMBODIMENTS

Figure 1:
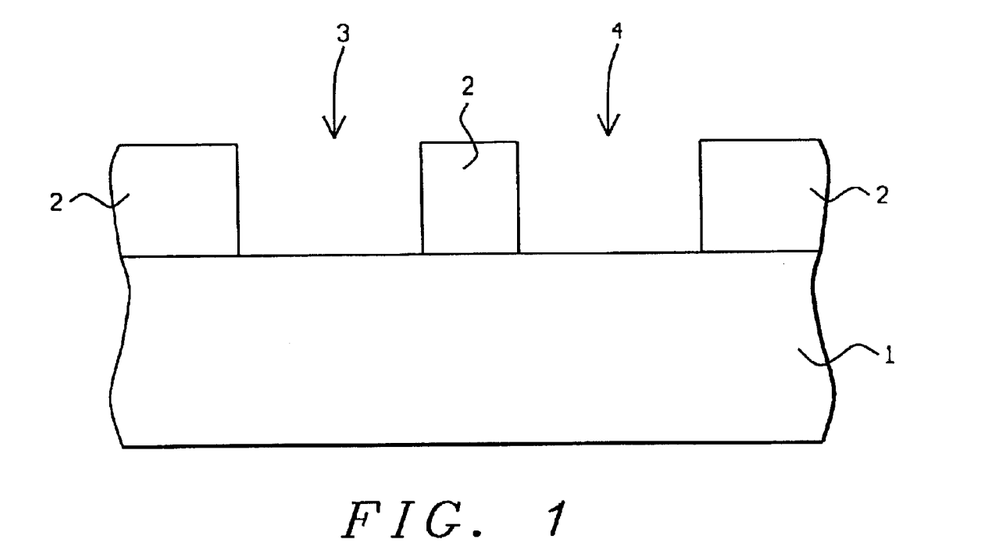
FIGS. 1–9, which schematically in cross-sectional style, describe key stages used to fabricate a CMOS device, featuring the integration of super-steep retrograde (SSR), twin well regions and isolation features, achieved via implementation of two selective epitaxial growth (SEG), procedures.

The method of fabricating a CMOS device featuring SSR twin well regions, achieved via dual SEG procedures, will now be described in detail. Semiconductor substrate 1, comprised of single crystalline, P type silicon, with a <100> crystallographic orientation, is used and schematically shown in FIG. 1. A silicon dioxide layer is next thermally grown to a thickness between about 1.5 to 2.0 um, in an oxygen-steam ambient, at a temperature between about 800 to 1000° C. A photoresist shape, not shown in the drawings, is then used as an mask to allow an anisotropic reactive ion etching (RIE), procedure, to form silicon dioxide shapes 2, shown schematically in FIG. 1. The RIE procedure was performed using $CHF_3$ as a selective etchant for silicon dioxide. The photoresist shape used to define silicon dioxide shapes 2, is removed via plasma oxygen ashing procedures. Opening 3, located between silicon dioxide shapes, to be the location for a subsequently fabricated PMOS device, will be referred to as PMOS region 3, while opening 4, will be referred to as NMOS region 4, to be used for accommodation of a subsequently fabricated NMOS device.

Figure 2:
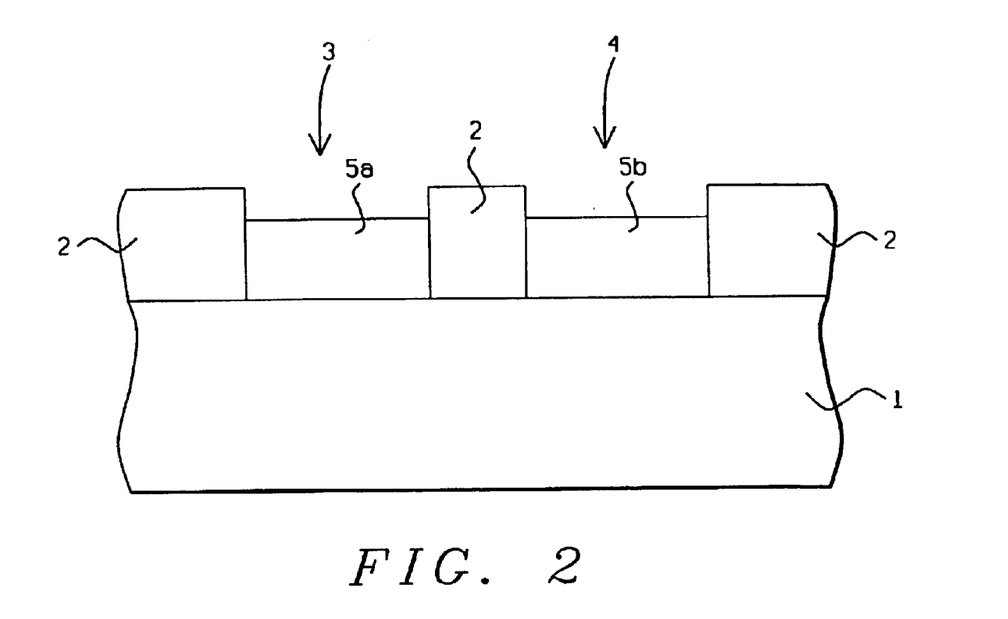

A first selective epitaxial growth (SEG), procedure is now employed, and illustrated schematically in FIG. 2. Bottom silicon shapes 5a and 5b, are selectively grown on exposed portions of semiconductor substrate 1, at a thickness between about 1.0 to 1.5 um. Bottom silicon shape 5a, formed in PMOS region 3, and bottom shape 5b, formed in NMOS region 4, are epitaxially grown at a temperature between about 800 to 1100° C., using silane or disilane as a source. The bottom silicon shapes are grown intrinsically, or if desired can be grown as lightly doped P type, silicon, via the addition of diborane to the silane, or disilane ambient.

Figure 3:
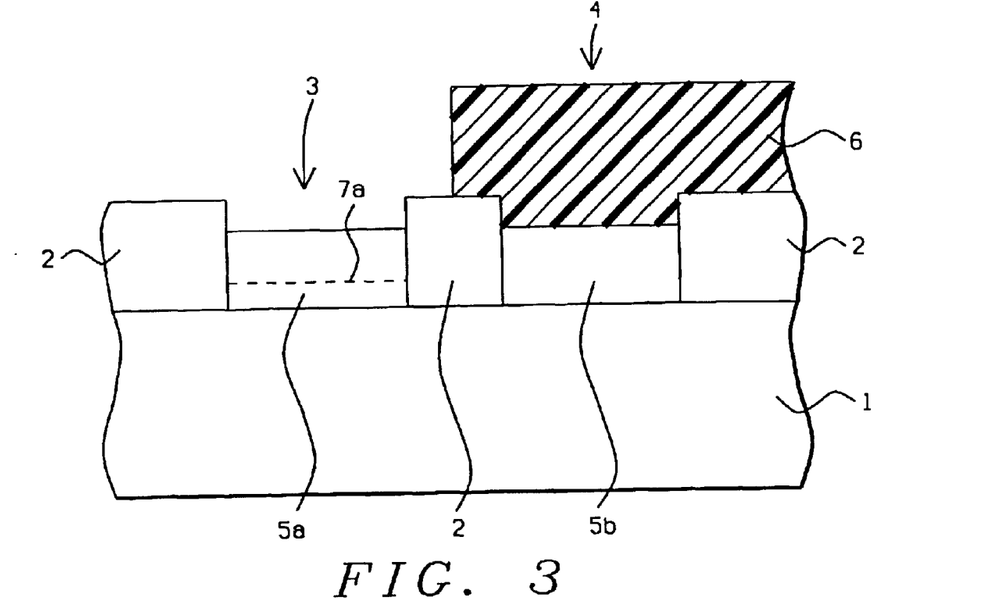

Prior to a subsequent implantation procedure an optional silicon dioxide layer can be grown to a thickness between about 80 to 150 Angstroms, via oxidation in a dry oxygen ambient, at a temperature between about 900 to 1100° C. The silicon dioxide layer, not shown in the drawings can be employed as a scree oxide layer for the subsequent ion implantation procedure. Photoresist shape 6, is next formed as a block out mask to protect NMOS 4, from an ion implantation procedure used to provide N type ions 7a, needed for a subsequent SSR N well region in PMOS region 3. The implantation procedure is performed using arsenic or antimony ions, implanted at an energy between about 50 to 200 KeV, and at a dose between about 0.5E12 to 3E13 atoms/$cm^2$. Unactivated, N type ions 7a, located in bottom silicon shape 5a, will subsequently be subjected to an anneal procedure used to activate and to distribute the N type ions, and to form an SSR N well region. The result of these procedures is schematically shown in FIG. 3.

Figure 4:
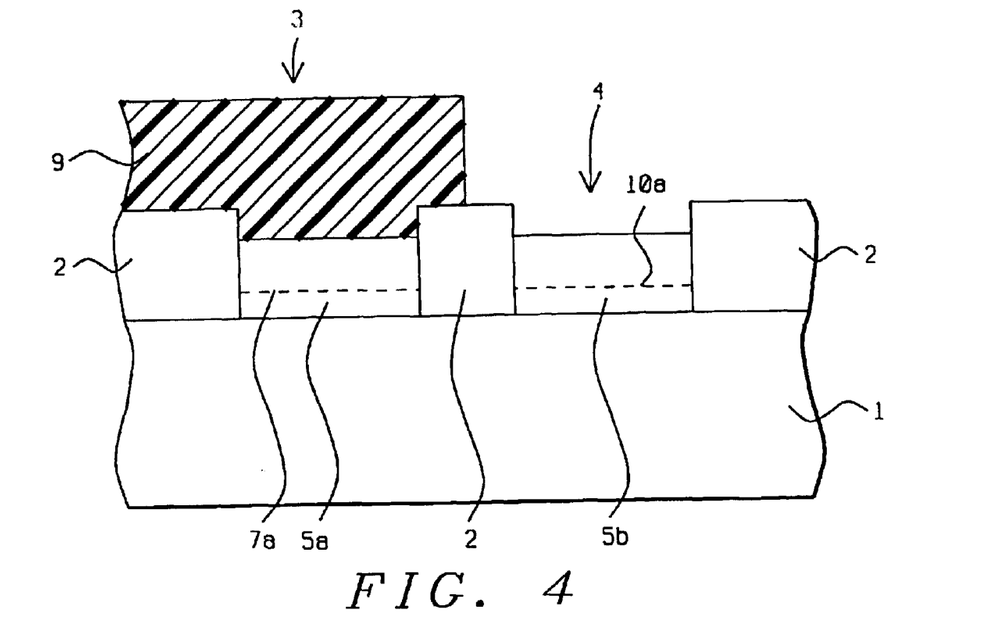

After removal of photoresist shape 6, via plasma oxygen ashing procedures, photoresist shape 9, is formed in PMOS region 3, to be used as a block out mask, to protect PMOS region 3, from an ion implantation procedure used to provide P type ions 10a, needed for formation of a subsequent SSR P well region in NMOS region 4. This implantation procedure is performed using boron or indium ions, implanted at an energy between about 1 to 10 KeV, at a dose between about 0.5E12 to 3E13 atoms/$cm^2$. Unactivated, P type ions 10a, located in bottom silicon shape 5b, will subsequently be subjected to an anneal procedure used to activate and to distribute the P type ions, and to form an SSR P well region. This is schematically shown in FIG. 4. Photoresist shape 9, is removed again via use of a plasma oxygen ashing procedure.

Figure 5:
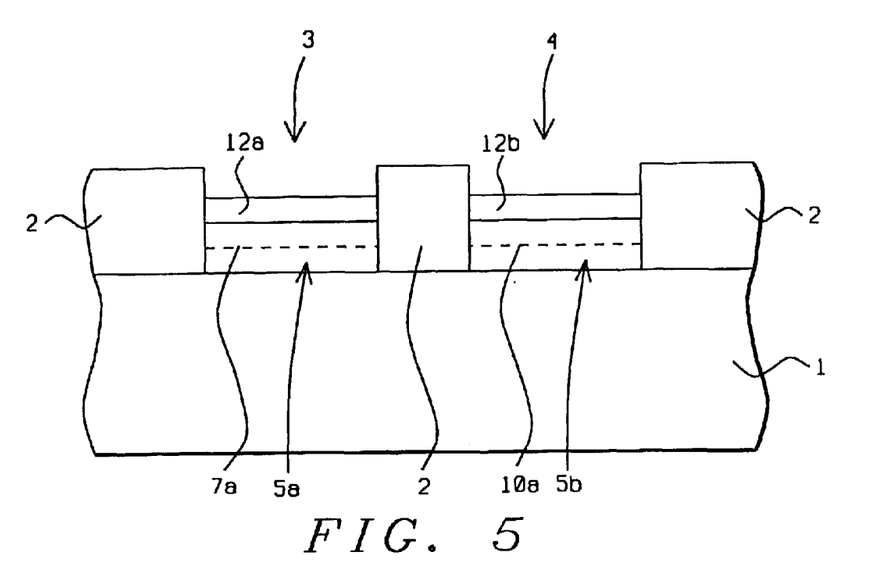

If the optional silicon dioxide layer were used, it would now removed via use of a dilute hydrofluoric acid solution. After a cleaning procedure, employing wet cleans used to remove organic as well as inorganic impurities, a second SEG procedure is performed. Second SEG procedure is performed at a temperature between about 900 to 1100° C., using silane, or disilane as a silicon source, resulting in the selective growth of top silicon shape 12a, on bottom silicon shape 5a, in PMOS region 3, and resulting in the selective growth of top silicon shape 12b, on bottom silicon shape 5b, in NMOS region 4. If desired a laser anneal procedure can be performed prior to selective growth of the top silicon shapes, to further insure the integrity of the top surface of the bottom silicon shapes, in terms of contamination. Top silicon shapes, shown schematically in FIG. 5, are selectively grown intrinsically, to a thickness between about 0.5 to 1.0 um. The combined thicknesses of the top and bottom silicon shapes is still less than the thickness of silicon dioxide shapes 2.

Figure 6:
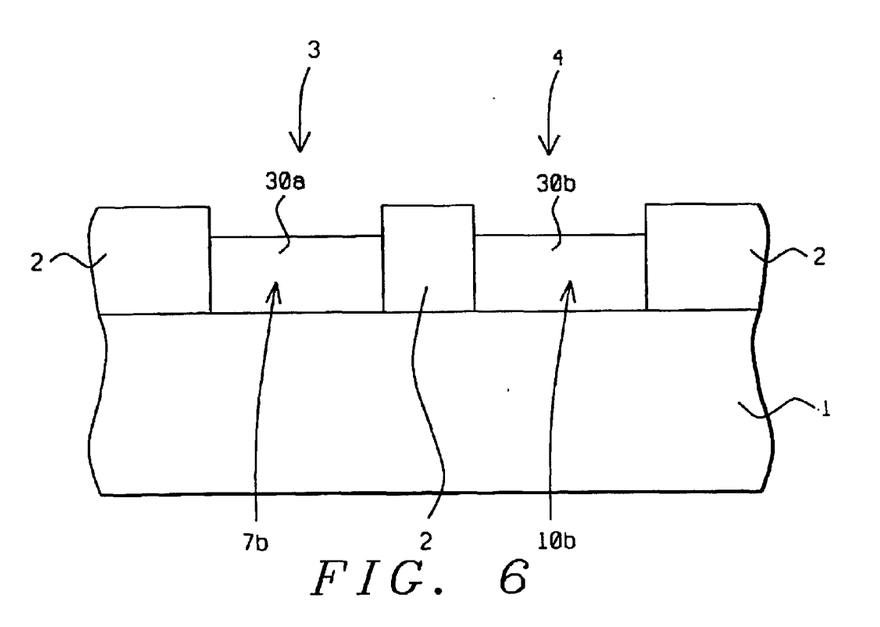

A critical anneal procedure is next performed to activate the implanted ions, as well as to distribute the activated implanted ions, resulting in the formation of the desired SSR twin well regions. The anneal procedure can be performed using conventional furnace procedures at a temperature between about 800 to 1000° C., for a time between about 5 to 30 min, in an inert ambient, such as nitrogen or argon. If desired the anneal procedure can be accomplished via use of rapid thermal anneal (RTA), procedures performed at a temperature between about 800 to 1100° C., for a time between about 5 to 120 sec., again performed in an inert ambient. The anneal procedure results in SSR N well region 7b, in silicon shape 30a, in PMOS region 3, with silicon shape 30a, being a composite silicon shape comprised of top silicon shape 12a, and bottom silicon shape 5a The dopant profile of SSR N well region 7b, features the largest concentration of N type dopant located in a center portion of silicon shape 30a, while a lower concentration of N type dopants is located at the top surface of silicon shape 30a. This profile, presented by SSR N well region 7b, featuring a low dopant concentration at the top surface allows a reduction in threshold voltage to be realized, while the higher dopant concentration located at the center of the SSR N well region, reduces the risk of a source/drain punchthrough effect. Similarly the dopant profile now established for SSR P well region 10b, in NMOS region 4, presents profile characteristics similar to the dopant profile of SSR P well region 7b. The low dopant concentration, located at the surface of silicon shape 30b, in NMOS region 4, allows the NMOS threshold voltage to be minimized, allowing lower device operating conditions to be used. In addition the highest P type concentration established in SSR P well region 10b, reduces the risk of source/drain punch through. Silicon shape 30a, in PMOS region 3, and silicon shape 30b, located in NMOS region 4, represent the combination of the bottom and top silicon shapes, obtained via use of the two SEG procedures. The use of implantation only into the bottom silicon shapes, allowed lower implantation energies to be used when compared to counterparts in which only a single, thicker silicon shape was used, warranting a higher implant energy. The result of the anneal procedure is schematically shown in FIG. 6.

Gate insulator layer 13, comprised of silicon dioxide, is next thermally grown to a thickness between about 8 to 100

Angstroms, in an oxygen-steam ambient, at a temperature between about 800 to 1100° C. Conductive gate structures 14, are next formed, comprised of polysilicon or of polycide, (metal silicide-polysilicon). The polysilicon gate structure option is initiated via deposition of a polysilicon layer at a thickness between about 1000 to 2500 Angstroms, using low pressure chemical vapour deposition (LPCVD), procedures. The polysilicon layer can be doped in situ during deposition via the addition of arsine, or phosphine to a silane ambient, or the polysilicon layer can be deposited intrinsically than doped via implantation of arsenic or phosphorous ions. Photoresist shapes are than used as etch masks to allow an anisotropic RIE procedure, using $Cl_2$ or $SF_6$ as an etchant, to define conductive gate structures 14, schematically shown in FIG. 7. The polycide gate structure option is achieved via deposition of an underlying polysilicon layer and of an overlying metal silicide layer, such as a tungsten silicide layer, with the thickness of the polycide layer equal to the thickness of the previously describe polysilicon gate structure option. Photolithographic and anisotropic dry etching procedures, similar to the procedures used to define the polysilicon gate structure can again be employed to define the polycide gate structure. Removal of the gate defining, photoresist shape, is then accomplished via plasma oxygen ashing procedures. The width of conductive gate structures 14, is between about 0.05 to 20 um, allowing narrow channel regions to be realized.

Figure 7:
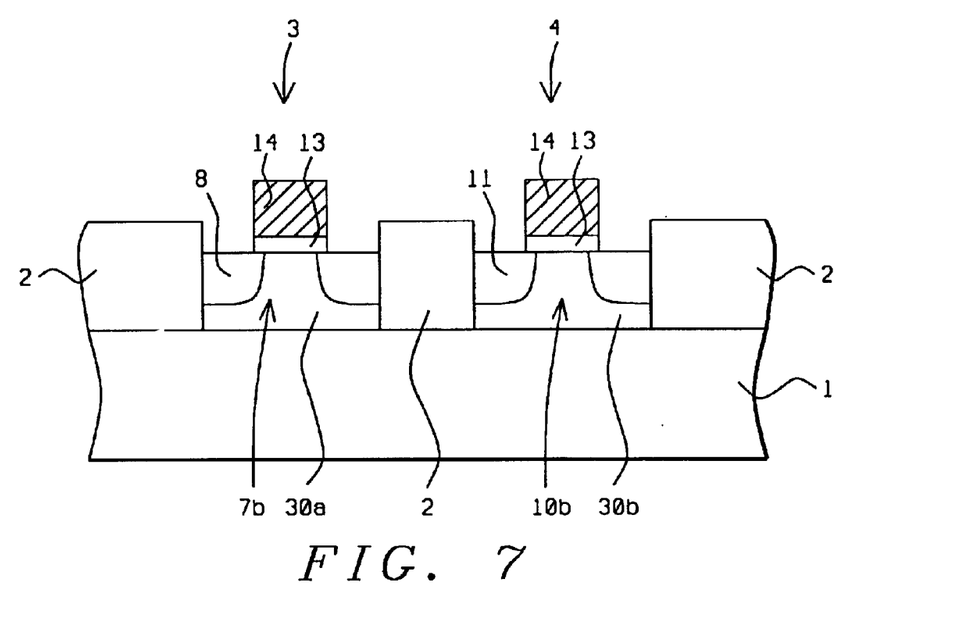
Figure 8:
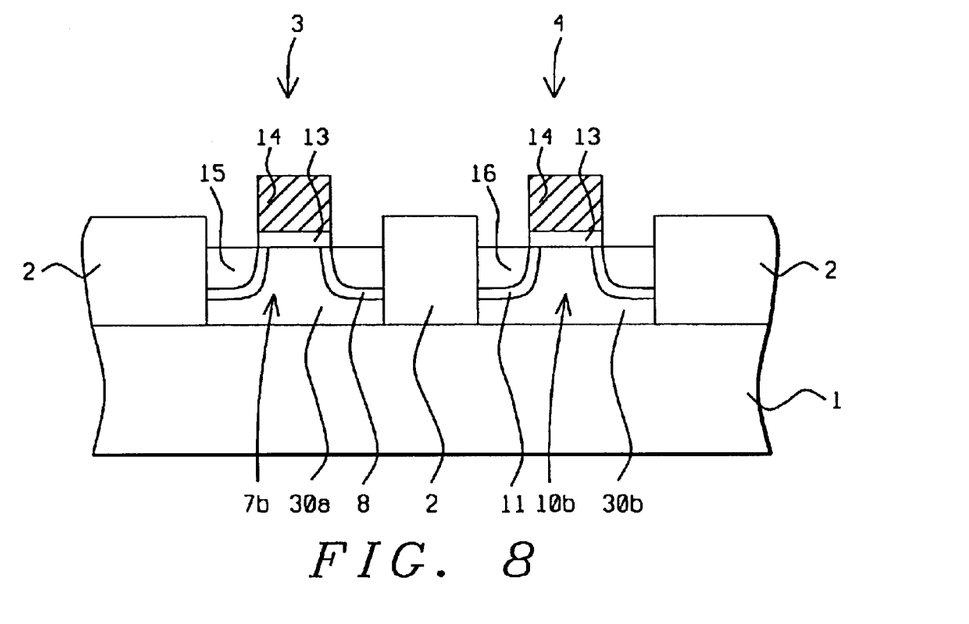
Figure 9:
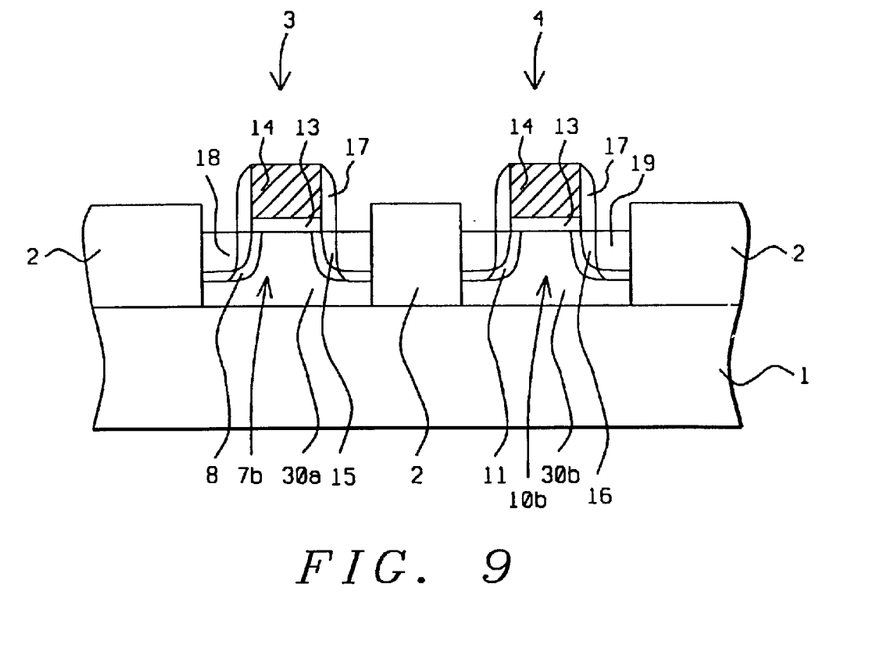

If desired N type pocket implant regions 8, in PMOS region 3, and P type pocket implant regions 11, in NMOS region 4, can next be formed featuring dopant concentrations higher than the dopant concentrations of the adjacent SSR twin well regions. The pocket implant regions, used to accommodate subsequent source/drain regions, will reduce the risk of source/drain punch through leakage in the narrow channel regions located underlying the narrow gate structures. A photoresist shape, not shown in the drawings, is used to block out NMOS region 4, from implantation of arsenic ions, resulting in N type pocket region 8, in regions of SSR N well region 7b, of PMOS region 3. N type pocket region 8, is formed in regions of SSR N well region 7b, not covered by gate structure 14, via implantation of N type ions at an energy between about 80 to 120 KeV, and at a dose between about 5E12 to 5E13 atoms/cm². This is schematically shown in FIG. 7. At this stage of the fabrication sequence, P type, lightly doped source/drain region 15, is formed in the same portion of SSR N well region 7b, used to accommodate N type pocket region 8. This is accomplished via implantation of boron or $BF_2$ ions, at an energy between about 0.4 to 20 KeV, at a dose between about 1E13 to 1E15 atoms/cm². This is schematically shown in FIG. 8. The photoresist shape used to block out NMOS region 4, is now removed via plasma oxygen ashing procedures, followed by a chemical resist strip procedure using sulfuric acid and hydrogen peroxide.

Pocket implants for NMOS region 4, if desired, are next addressed and schematically illustrated in FIG. 7. To reduce the risk of leakage or punch through between subsequent N type source/drain regions, P type pocket regions 11, with a dopant concentration greater than the P type dopant concentration of adjacent SSR P well region 10b, is formed. A photoresist shape, not shown in the drawings, is used as mask to protect PMOS region 3, from implantation of boron ions, at an energy between about 10 to 30 KeV, at a dose between about 1E13 to 1E14 atoms/cm², resulting in P type pocket regions 11. With the photoresist shape still in place implantation of arsenic ions, at an energy between about 1 to 5 KeV, at a dose between about 1E14 to 5E15 atoms/cm², is employed to create N type, lightly doped region 16, in P type pocket region 11. This is schematically shown in FIG. 8. It should be noted that the pocket implant regions in both PMOS region 3, and NMOS region 4, extend laterally into the channel region to fully accommodate the lightly doped source/drain regions. This is accomplished via use of angled implantation procedures.

After removal of the PMOS block out photoresist shape, via plasma oxygen ashing and the wet sulfuric acid-hydrogen peroxide strip, insulator spacers 17, are formed on the sides of gate structures 14, located in PMOS region 3, and in NMOS region 4 This is accomplished via deposition of an insulator layer such as silicon oxide, or silicon nitride, via LPCVD or via plasma enhanced chemical vapour deposition (PECVD), procedures, to a thickness between about 500 to 800 Angstroms. An anisotropic RIE procedure is next employed, using $CHF_3$ or $CF_4$ as an etchant, to define insulator spacers 17. After formation of a photoresist shape, not shown in the drawings, and used to block out NMOS region 4, heavily doped, P type source/drain region 18, is next formed in portions of silicon shape 30a, not covered by gate structure 14, or by insulator spacers 17. Heavily doped, P type source/drain region 18, is obtained via implantation of boron ions at an energy between about 3 to 5 KeV, at a dose between about 1E15 to 5E15 atoms/cm². After removal of the photoresist shape, used to protect NMOS 4, from the procedure used to create the heavily doped, P type source/drain region 18, another photoresist shape is formed to block out PMOS region 3, from the procedure used to create heavily doped, N type source/drain region 19. This is accomplished via implantation of arsenic or phosphorous ions, at an energy between about 40 to 60 KeV, at a dose between about 3E15 to 6E15 atoms/cm². The photoresist shape used to block out PMOS region 3, from the heavily doped, N type source/drain implantation procedure, is again removed via plasma oxygen ashing procedures. An anneal procedure, performed using either conventional furnace, or RTA procedures, is employed to activate the implanted ions in the pocket implant regions, in the lightly doped source/drain regions, and in the heavily doped source/drain regions.

While this invention has been particularly shown and described with reference to, the preferred embodiments thereof, it will be understood by those skilled in the art that various changes in form and details may be made without departing from the spirit and scope of this invention.

What is claimed is:

1. A method of forming a super-steep retrograde (SSR) well region in a silicon shape, via use of two selective epitaxial growth (SEG), procedures, comprising the steps of:

forming insulator shapes on a semiconductor substrate with a space located between said insulator shapes exposing a portion of said semiconductor substrate;

performing a first SEG procedure to selectively form a bottom silicon shape on said portion of said semiconductor substrate exposed in a bottom portion of said space;

performing an ion implantation procedure to place a body of ions in a said bottom silicon shape;

performing a second SEG procedure to selectively form a top silicon shape on said bottom portion of said silicon shape, resulting in a composite silicon shape comprised of said top silicon shape overlying said bottom silicon shape; and performing an anneal procedure to activate, and to distribute said bottom of ions, and to form said SSR well region in said composite silicon shape.

2. The method of claim 1, wherein said insulator shapes are silicon dioxide shapes at a thickness between about 1.5 to 2.0 um.

3. The method of claim 1, wherein said first SEG procedure is performed at a temperature between about 800 to 1100° C., using silane, or disilane as a silicon source.

4. The method of claim 1, wherein said bottom silicon shape is selectively grown to a thickness between about 1.0 to 1.5 um.

5. The method of claim 1, wherein said ion implantation procedure is performed using arsenic or antimony ions, at an energy between about 50 to 200 KeV, at a dose between about 0.5E12 to 3E13 atoms/cm$^2$.

6. The method of claim 1, wherein said ion implantation procedure is performed using boron of indium ions, at an energy between about 1 to 10 KeV, at a dose between about 0.5E12 to 3E13 atoms/cm$^2$.

7. The method of claim 1, wherein said second SEG procedure is performed at a temperature between about 900 to 1100° C., using silane, or disilane as a silicon source.

8. The method of claim 1, wherein said top silicon shape is selectively grown to a thickness between about 0.5 to 1.0 um.

9. The method of claim 1, wherein said anneal procedure is performed using conventional furnace procedures, at a temperature between about 800 to 1000° C., for a time between about 5 to 30 min, in an inert ambient such as nitrogen or argon.

10. The method of claim 1, wherein said anneal procedure is performed using rapid thermal anneal procedures, at a temperature between about 800 to 1100° C., for a time between about 5 to 120 sec., in an inert ambient such as nitrogen or argon.

11. The method of claim 1, wherein said SSR well region is comprised with the highest dopant concentration in the center of said final silicon shape, and comprised with the lowest dopant concentration at the top, and at the bottom portions of said composite silicon shape.

12. A method of fabricating a complimentary metal oxide semiconductor (CMOS), device on a semiconductor substrate, featuring twin, super-steep retrograde (SSR), well regions formed in silicon shapes which in turn are obtained via two selective epitaxial growth procedures, comprising the steps of:

forming a silicon dioxide shape on said semiconductor substrate with a first opening exposing a first portion of said semiconductor substrate designated as a P type metal oxide semiconductor (PMOS) region, to be used for a P channel type device of said CMOS device, and with a second opening exposing a second portion of said semiconductor substrate designated as an N type metal oxide semiconductor (NMOS) region, to be used for an N channel type device of said CMOS device;

performing a first SEG procedure to selectively grow a first bottom silicon shape on said first portion of said semiconductor substrate, located in said PMOS region, and to selectively grow a second bottom silicon shape on said second portion of said semiconductor substrate, located in said NMOS region;

performing a first ion implantation procedure to place N type dopants in said first bottom silicon shape, located in said PMOS region;

performing a second ion implantation procedure to place P type dopants in said second bottom silicon shape, located in said NMOS region;

performing a second SEG procedure to selectively grow a first top silicon shape on said first bottom silicon shape, resulting in a first composite silicon shape in said PMOS region, comprised of said first top silicon shape on said first bottom silicon shape, and to selectively grow a second top silicon shape on said second bottom silicon shape, resulting in a second composite silicon shape comprised of said second top silicon shape on said second bottom silicon shape;

performing an anneal procedure to activate said N type dopants and to distribute N type dopants in said first composite silicon shape, resulting in an SSR N well region in said PMOS region, and to activate said P type dopants and to distribute said P type dopants in said second composite silicon shape, resulting in an SSR P well region in said NMOS region;

growing a silicon dioxide gate insulator layer on the top surface of said first composite silicon shape and on the top surface of said second composite silicon shape;

forming a first gate structure on a portion of said silicon dioxide gate insulator layer located in said PMOS region, and forming a second gate structure on a portion of said silicon dioxide gate insulator layer located in said NMOS region;

forming an N type pocket region in said PMOS region, in a portion of said first composite silicon shape not covered by said first gate structure, wherein the dopant level of said N type pocket region is greater than the N type doping level in said SSR N well region;

forming a P type pocket region in said NMOS region, in a portion of said second composite silicon shape not covered by said second gate structure, wherein the dopant level of said P type pocket region is greater than the P type dopant level in said SSR P well region;

forming a P type lightly doped source/drain region in a portion of said N type pocket region in said PMOS region;

forming an N type lightly doped source/drain region in a portion of said P type pocket region in said NMOS region;

forming insulator spacers on the sides of gate structures;

forming a heavily doped P type source/drain region in said PMOS region, in a portion of said first composite silicon shape not covered by said first gate structure or by insulator spacers; and forming a heavily doped N type source/drain region in said NMOS region, in a portion of said second composite silicon shape not covered by said second gate structure or by insulator spacers.

13. The method of claim 12, wherein said silicon dioxide shape is comprised with a thickness between about 1.5 to 2.0 um.

14. The method of claim 12, wherein said first SEG procedure is performed at a temperature between about 800 to 1100° C., using silane, or disilane as a silicon source.

15. The method of claim 12, wherein said first bottom silicon shape and said second bottom shape are selectively grown to a thickness between about 1.0 to 1.5 um.

16. The method of claim 12, wherein said first ion implantation procedure is performed using arsenic or antimony ions, at an energy between about 50 to 200 KeV, at a dose between about 0.5E12 to 3E13 atoms/cm$^2$.

17. The method of claim 12, wherein said second ion implantation procedure is performed using boron of indium ions, at an energy between about 1 to 10 KeV, at a dose between about 0.5E12 to 3E13 atoms/cm$^2$.

18. The method of claim 12, wherein said second SEG procedure is performed at a temperature between about 900 to 1100° C., using silane, or disilane as a silicon source.

19. The method of claim 12, wherein said first top silicon shape and said second top silicon shape are selectively grown to a thickness between about 0.5 to 1.0 um.

20. The method of claim 12, wherein said anneal procedure is performed using conventional furnace procedures, at a temperature between about 800 to 1000° C., for a time between about 5 to 30 min, in an inert ambient such as nitrogen or argon.

21. The method of claim 12, wherein said anneal procedure is performed using rapid thermal anneal procedures, at a temperature between about 800 to 1100° C., for a time between about 5 to 120 sec., in an inert ambient such as nitrogen or argon.

22. The method of claim 12, wherein said SSR N well region, located in said PMOS region, is comprised with the highest N type dopant concentration in the center of said first composite silicon shape, and comprised with the lowest N type dopant concentration at the top, and at the bottom portions of said first composite silicon shape.

23. The method of claim 12, wherein said SSR P well region, located in said NMOS region, is comprised with the highest P type dopant concentration in the center of said second composite silicon shape, and comprised with the lowest P type dopant concentration at the top, and at the bottom portions of said second composite silicon shape.

24. The method of claim 12, wherein said silicon dioxide gate insulator layer is obtained at a thickness between about 8 to 100 Angstroms, via thermal oxidation procedures performed at a temperature between about 800 to 1100° C., in an oxygen-steam ambient.

25. The method of claim 12, wherein said gate structures are polysilicon gate structures, defined via anisotropic reactive ion etching procedures applied to a polysilicon layer in turn obtained via LPCVD procedures at a thickness between about 1000 to 2500 Angstroms.

26. The method of claim 12, wherein said N type pocket region, located in said PMOS region, is obtained via implantation of arsenic ions, at an energy between about 80 to 120 KeV, at a dose between about 5E12 to 5E13 atoms/cm$^2$.

27. The method of claim 12, wherein said P type pocket region, located in said NMOS region, is obtained via implantation of boron ions, at an energy between about 10 to 30 KeV, at a dose between about 1E13 to 1E14 atoms/cm$^2$.

28. The method of claim 12, wherein said insulator spacers are comprised of silicon oxide or silicon nitride, at a thickness between about 500 to 800 Angstroms.

* * * * *